United States Patent [19]

Tada et al.

[11] Patent Number: 4,678,534
[45] Date of Patent: Jul. 7, 1987

[54] METHOD FOR GROWING A SINGLE CRYSTAL

[75] Inventors: Koji Tada; Masami Tatsumi; Toshihiro Kotani; Shinichi Sawada, all of Osaka, Japan

[73] Assignee: Sumitomo Electric Industries, Ltd., Osaka, Japan

[21] Appl. No.: 733,361

[22] Filed: May 13, 1985

[30] Foreign Application Priority Data

Jun. 8, 1984 [JP] Japan ................... 59-117845

[51] Int. Cl.$^4$ .................................. C30B 27/02
[52] U.S. Cl. ...................... 156/607; 156/617 SP; 156/617 V; 156/619; 156/DIG. 89
[58] Field of Search ............ 156/607, 617 SP, 617 V, 156/618, 619, DIG. 70, DIG. 89

[56] References Cited

U.S. PATENT DOCUMENTS

| 3,260,573 | 7/1966 | Ziegler | 156/619 |
| 3,929,557 | 12/1975 | Goodrum | 156/618 |

FOREIGN PATENT DOCUMENTS

| 123585 | 9/1979 | Japan | 156/607 |
| 170891 | 10/1982 | Japan | 156/617 SP |
| 135626 | 8/1983 | Japan | 156/607 |
| 131600 | 7/1984 | Japan | 156/617 SP |
| 138292 | 2/1985 | Japan | 156/607 |

OTHER PUBLICATIONS

Compound Semiconductors, vol. I, Preparation of III-V Compounds, pp. 256-260, 1962.
J. K. Kennedy, et al, "Study Czochralski Liquid-Seal Crystal Growing Technique", Rome Air Development Center, Apr. 1979.
Journal of Crystal Growth, 24/25, M. Moulin et al, Growth of GaAs Single Crystals by a Rotating Liquid Seal Method, (1974), pp. 376-379.
Journal of Crystal Growth, 19, P. C. Leuing et al, Liquid-Seal Czochralski Growth of Gallium Arsenide, (1973) pp. 356-358.

*Primary Examiner*—David L. Lacey
*Attorney, Agent, or Firm*—Cushman, Darby & Cushman

[57] ABSTRACT

A modified liquid encapsulated Czockralski method for growing a single crystal of compound semiconductor is disclosed. This method uses two vessels. An inner vessel is filled with an inactive gas, a gas of an element of group V and optionally an impurity gas. The inner vessel encloses a crucible containing compound semiconductor material, an encapsulant material, and optionally an impurity element. An outer vessel is filled only with the inactive gas. The total pressure of the inner atmosphere is equal to or higher than that of the outer atmosphere. The partial pressure of the gas of the element of group V is larger than the dissociation pressure of the element of group V near the melting point of the compound semiconductor.

4 Claims, 1 Drawing Figure

METHOD FOR GROWING A SINGLE CRYSTAL

BACKGROUND OF THE INVENTION

This invention relates to a method for growing a single crystal of compound semiconductors.

Single crystals of compound semiconductors have a wide scope of applications, e.g. substrates for integrated circuits, light emitting diodes or various kinds of detecting devices. According to the desired application of the semiconductor, semi-insulating, n-type or p-type single crystals are grown.

In this specification, compound semiconductors are the compound semiconductors of groups III-V and groups II-VI on the periodic table. The compound semiconductors of groups III-V are InP, InAs, GaAs, GsP, InSb, GaAb, etc. The compound semiconductors of groups II-VI are ZnSe, CdTe, ZnS, etc.

Conventional methods for growing a semiconductor crystal will be explained. Among several methods of manufacturing single crystals of compound semiconductors, liquid encapsulated Czockralski method (LEC) and horizontal Bridgman method (HB) are most preferable for industrial production.

The horizontal Bridgman method is a boat method which grows a single crystal in a boat by moving a temperature distribution along a horizontal direction.

The most powerful method among the category of pulling methods is LEC method, which grows a single crystal by pulling up a seed crystal from a crucible containing a compound melt covered by liquid encapsulant.

There is a problem in manufacturing compound semiconductors of groups III-V in that it is difficult to make a stoichiometric single crystal, because of the high dissociation pressure of the elements of group V.

In the LEC method in order to prevent the elements of group V from escaping, the material melt is covered with a liquid encapsulant which is pressed by inert gas or nitrogen gas at a high pressure. The liquid covering the material melt is called liquid encapsulant. The liquid encapsulant can effectively prevent the escape of the elements of group V. However a portion of the elements volatilizes and passes through the pressurized liquid encapsulant.

The liquid encapsulant must be strongly pressurized. Thus the whole apparatus is enclosed by a pressure vessel, and inert gas or nitrogen gas is filled in the pressure vessel up to several tens of atmospheres.

Because dense gas is filled in the pressure vessel, forcible gas convection occurs. The atmosphere in the vessel is thermally unstable because of the forcible convection. Therefore the single crystal is forcibly cooled immediately after it is pulled above the melt. Therefore thermal stress is apt to occur in the grown crystal. Strong thermal stress heightens the dislocation density of the crystal. This is a serious defect in the conventional LEC method.

A novel method belonging to a category of pulling methods for crystal growth has been proposed. It is called the vertical vapor-pressure-controlling method. Unlike the LEC method wherein only the area near the crucible is heated, in the vapor-pressure-controlling method, the whole of the pressure vessel is heated from top to bottom. Therefore the temperature gradient along the vertical direction is much smaller than that in the LEC method. It uses no liquid encapsulant. Material melt in a crucible contacts and keeps equilibrium with the gas filled in the pressure vessel. The pressure of the filled gas is low.

Furthermore the gas filled in the vessel is not an inert gas or a nitrogen gas, but a gas of an element of group V. A lump of an element of group V is placed at a pertinent position in the vessel. It is heated up to a pertinent temperature which realizes a desirable vapor pressure of the element of group V in the vessel.

Because the vapor pressure of the element of group V keeps equilibrium throughout the vessel, the vapor pressure of the element of group V in the material melt in the crucible is determined by the vapor pressure at the lowest temperature in the vessel.

Because this method is one of the pulling methods for crystal growth, this method grows a single crystal by dipping a seed crystal into a material melt and pulling a single crystal in succession to the seed crystal.

The pressure in the vessel is not so high as previously mentioned. In many cases, the pressure is determined to be 1 atm or slightly more than 1 atm. The vertical vapor-pressure-controlling method would be similar to an imaginary method which would be obtained by erecting the horizontal Bridgman method. The temperature of the upper space in the vessel is kept at about 650° C. in the case of GaAs crystal growth.

Keeping the equilibrium of the vapor pressure in the vessel and preventing volatilization of the elements of group V from the melt and the crystal grown, the method pulls up a single crystal. Then the method can make a stoichiometric single crystal.

The methods described are applicable to the crystal growth of compound semiconductors of groups II-VI.

In principle the newly-proposed vertical vapor-pressure-controlling method is an excellent method. However the gas filled in the vessel is only the gas of the element of group V without inert gas or nitrogen gas. The gas pressure is much smaller than that in the LEC method. The fluctuation of vapor pressure is considerably large. The large probability of fluctuation makes it difficult to control the vapor pressure of the element of group V in the vessel.

The vapor pressure of the element of group V in the vessel is controlled by heating the coldest part of the vessel at a pertinent temperature. A slight change of temperature, however, causes a large change of vapor pressure of the element of group V. Subtle pressure control is difficult. Therefore the elements of group V are inclined to volatilize from a material melt or a grown crystal. Thus, the vertical vapor-pressure-controlling method has defects in that it requires complex apparatuses, and operations of the apparatuses are difficult. These difficulties would appear when compound semiconductors of groups II-VI are made by this method.

SUMMARY OF THE INVENTION

This invention proposes a novel method which incorporates advantages both of the LEC method and the vertical vapor-pressure-controlling method in order to facilitate the pressure control.

The characteristics of the invention are:

(a) the gas filled in the vessel is not only a gas of group V. Besides the gas of group V, the vessel contains an inert gas or a nitrogen gas, and an impurity gas, if necessary, (b) the material melt is covered with a liquid encapsulant, (c) two vessels are used. An outer vessel encloses an inner vessel. The pressure in the inner vessel is equilibrated with the pressure in the outer vessel. If necessary it is also allowable to set the pressure in the inner vessel slightly larger than the pressure in the outer vessel within the scope wherein the pressure balance is not destroyed between the inner vessel and the outer vessel.

DETAILED DESCRIPTION OF THE INVENTION

Figure 1:
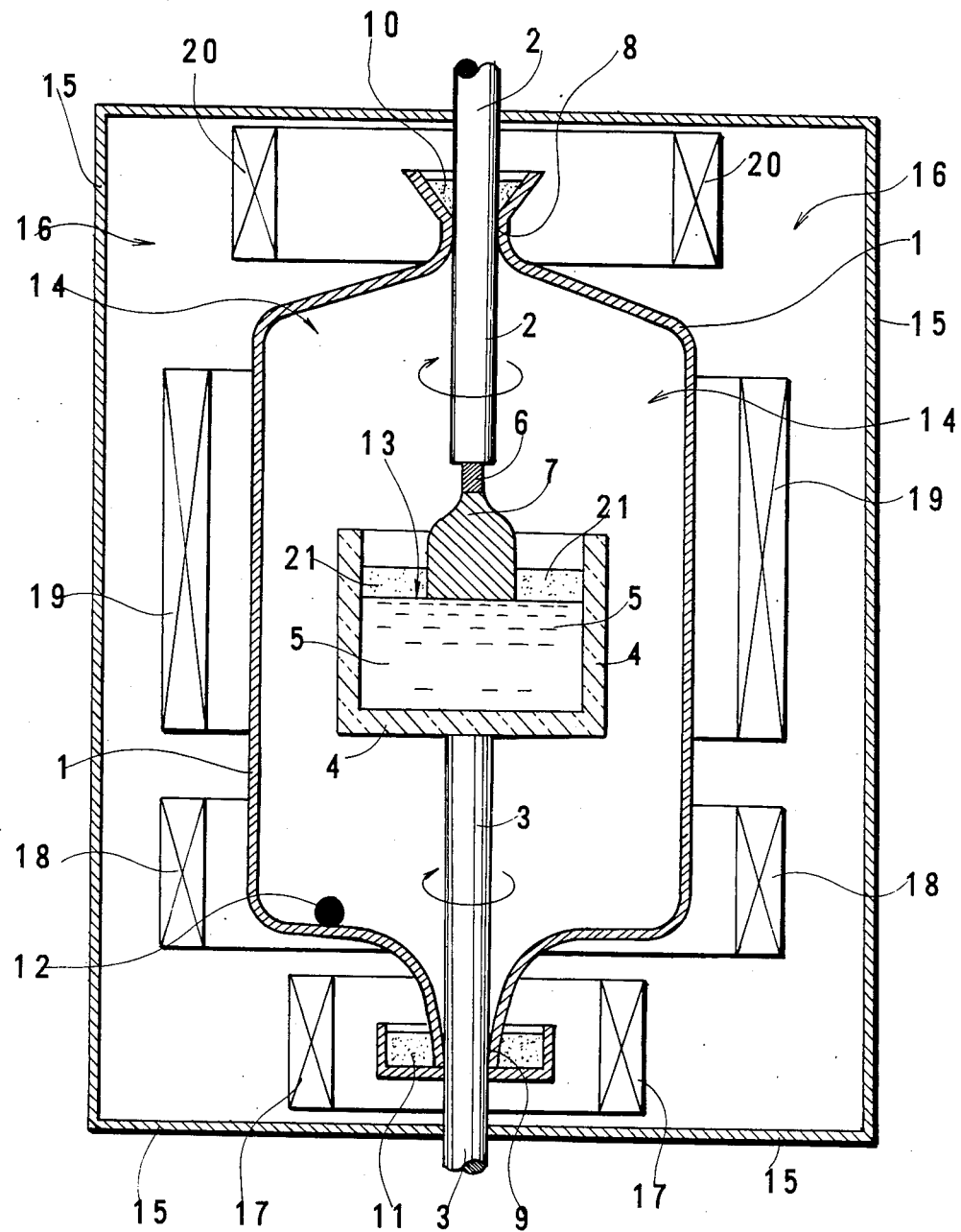
FIG. 1 is a sectional view of an apparatus of the invention for growing a single crystal.

Structures of the apparatus used in this invention for growing a single crystal will be explained with reference to FIG. 1.

The following descriptions relate to the crystal growth of compound semiconductors of groups III–V as an example. But the method is also applicable to the crystal growth of compound semiconductors of group II–VI.

Inner vessel 1 is an air-tight vessel. An upper shaft 2 passes through a top opening 8 of the inner vessel 1. A lower shaft 3 passes through a bottom opening 9 of the inner vessel 1. Both the upper shaft 2 and the lower shaft 3 can rotate and move up and down.

At the top end of the lower shaft 3 a crucible 4 is fixed. The crucible 4 contains a material melt 5 covered with a liquid encapsulant 21.

The inner vessel 1 must be made from a material that does not chemically react with hot gas of the element of group V—for example, As, Sb, or P. For example the material of the inner vessel 1 should be quartz, alumina, carbon, nitrides (silicon nitride, boron nitride, aluminum nitride), ceramics, molybdenum or other pertinent metals. The inner vessel 1 may be a vessel which is made from the material and is coated with some appropriate materials.

The crucible 4 can be made from pyrolytic boron nitride (PBN) for example.

A seed crystal 6 is fitted to the bottom end of the upper shaft 2. The seed crystal 6 is dipped into the material melt 5 and rotated. The seed crystal 6 is then slowly pulled up. A single crystal 7 is grown in succession to the seed crystal 6.

The structure of the inner vessel 1 includes a device to open or shut the vessel and a device for balancing the pressures between an inner atmosphere and an outer atmosphere. It is rather complex. But in FIG. 1 the inner vessel 1 is simplified. Around the top opening 8 of the upper shaft 2 and the bottom opening 9 of the lower shaft 3, liquid encapsulants 10 and 11 are filled to prevent the element of group V from escaping the inner vessel 1.

The liquid encapsulants 21, 10 and 11 are $B_2O_3$ in the case of a GaAs crystal growth. They are a eutectic material of NaCl and KCl in the case of GaSb etc.

In this example four heaters are used to cause gentle temperature gradients in the vessel 1.

A first heater 17 heats the bottom of the inner vessel 1. The function of the first heater 17 is to melt the encapsulant material into liquid and seal the inner vessel before the compound material is melted.

A second heater 18 heats the lower part of the inner vessel 1. A lump 12 of an element of group V, for example As, Sb, etc., is placed at the lower part of the inner vessel 1. The second heater 18 controls the vapor pressure of the element of group V by adjusting the temperature of the region.

A third heater 19 which is mounted at the middle height in the vessel heats and melts the compound material and the encapsulant material and keeps them in liquid state.

The single crystal 7 pulled up is heated by the third heater 19. The temperature in the crystal 7 does not decrease rapidly. Strong thermal stress does not occur in the single crystal 7 pulled up.

A fourth heater 20 heats the top part of the inner vessel 1. The fourth heater 20 is required to melt the liquid encapsulant 10 on the top opening 8 before the compound material and the encapsulant material in the crucible are molten.

By adjusting and readjusting the output powers of the first to the fourth heaters, an operator grows a single crystal in a gentle temperature gradient of the inner vessel 1.

The pressures of the inert gas or nitrogen gas and the gas of the element of group V effectively suppress the volatilization of the element of group V from the material melt 5 through the liquid encapsulant 21.

Furthermore because the pulled single crystal 7 exists under a partial pressure of the element of group V larger than the dissociation pressure at the temperature, the volatilization of the element of group V from the single crystal also hardly occurs.

To accomplish the effect above-mentioned, this invention controls the pressures of the liquid-encapsulated crucible 4, the inner vessel 1 and the outer vessel 15 in the following ways.

The outer vessel 15 is filled only with an inert gas or a nitrogen gas. Strictly speaking inert gas consists of helium gas, neon gas, argon gas, krypton gas and xenon gas. Nitrogen gas is not called inert gas in the strict meaning. However because nitrogen gas is chemically stable as well as inert gas, it is frequently used as an atmospheric gas in LEC methods. Therefore, a strictly-defined inert gas and a nitrogen gas will be referred to as inactive gas hereinafter. According to the definition the outer atmosphere 16 filling in the outer vessel 15 is simply called inactive gas. The pressure of the outer atmosphere is signified by $P_1$.

The inner atmosphere 14 in the inner vessel 1 comprises an inactive gas and a gas of an element of group V. Besides these gases, the inner atmosphere 14 contains an impurity gas, when an impurity element is doped to change the electric property of the single crystal to n-type, p-type or semi-insulating type. The impurity gas is added to prevent the volatilization of the impurity element from the single crystal pulled up.

$P_O$, $Q_O$ and $R_O$ signify the partial pressures of the inactive gas, the gas of element of group V and the impurity gas in the inner atmosphere 14.

In the vertical vapor-pressure-controlling method previously mentioned, the atmosphere in the vessel is only the gas of the element of group V. Thus the method is simply characterized by the conditions $P_O=0$ and $R_O=0$.

On the contrary conventional LEC methods are easily characterized by the conditions that $Q_O=0$, $R_O=0$ and $P_O$ is several tens of atmospheres.

This invention requires an additional outer vessel 15 enclosing the inner vessel 1. Besides the double vessel structure, this invention requires the following conditions of pressures:

$$P_O \neq 0 \quad (1)$$

$$Q_O \neq 0, \; Q_O \geqq Q_d \quad (2)$$

$$P_O + Q_O + R_O \geqq P_1 \quad (3)$$

where $Q_d$ is the dissociation pressure of the element of group V.

Namely the partial pressure $Q_O$ of the element of group V in the inner vessel should be equal to or larger than the dissociation pressure $Q_d$. The condition (3) signifies the total pressure in the inner vessel 1 should be equal to or larger than the pressure in the outer vessel 15.

The operations will now be explained. The outer vessel 15 and the inner vessel 1 are opened. The crucible 4, in which encapsulant material, polycrystal material and impurity element for doping if necessary, are charged, is fixed upon the lower shaft 3. A seed crystal 6 is fitted at the bottom of the upper shaft 2. A lump 12 of the element of group V is placed at a pertinent spot in the inner vessel 1.

Encapsulant material (which will be molten into liquid encapsulants 10 and 11) is supplied in the cavities on the top opening 8 and around the bottom opening 9 of the inner vessel 1. The inner vessel 1 and the outer vessel 15 are closed.

Inactive gas is filled in the inner vessel 1 and the outer vessel 15, keeping the pressure balance $P_O = P_1$.

When a volatile impurity element is added into the crucible 4 for impurity doping, the inner vessel 1 should contain the gas of the impurity element to prevent the volatilization of the impurity from the single crystal pulled up. The partial pressure of the impurity gas is denoted by $R_O$.

The first heater 17 and the fourth heater 20 are electrified. The encapsulant materials on the top opening 8 and around the bottom opening 9 are melted into liquid encapsulants 10 and 11.

The third heater 19 is electrified to heat the encapsulant material and compound material in the crucible 4. First the encapsulant material is melted into liquid encapsulant 21, which covers the compound material.

Next the compound material is heated to form a melt. Between the liquid encapsulant 21 and the material melt 5, a horizontal liquid-liquid interface 13 exists.

Here the compound material signifies the polycrystal of compound semiconductor of groups III–V and the impurity dopant.

Instead of compound polycrystal, the compound material can be directly composed in the crucible by charging adequate amounts of individual elements into the crucible and heating them up to a pertinent temperature.

The second heater 18 is electrified. The lump 12 of the element of group V is heated. A part of the lump 12 of the element of group V is sublimated. By the sublimation, the gas of the element of group V gradually fills the inner vessel 1. The partial pressure $Q_O$ of the element of group V increases from 0 atm to the vapor pressure determined only by the temperature.

The partial pressure $Q_O$ can be arbitrarily determined by adjusting the temperature of the lump 12 of the element of group V.

Finally the partial pressure $Q_O$ of the element of group V becomes uniform in the inner vessel 1. The pressure $Q_O$ must be kept higher than the dissociation pressure of the element at the temperature near the melting point of the compound semiconductor.

The pressure in the inner vessel 1 is $(P_O + Q_O + R_O)$. This is equal to or larger than the pressure $P_1$ of the outer vessel 15. Gas may flow from the inner atmosphere 14 to the outer atmosphere 16 through the liquid encapsulants 10 and 11. But it is impossible to have gas flow from the outer atmosphere 16 into the inner atmosphere 14.

Under these conditions, the seed crystal 6 is dipped into the material melt 5. The seed crystal 6 and the crucible 4 are rotated. The seed crystal 6 is gradually pulled up. A single crystal 7 is grown in succession to the seed crystal 6.

Advantages of the invention are explained below.

(A) This invention enables the growth of a single crystal with low dislocation density.

The single crystal is grown under a low gas pressure less than one in the LEC methods. The low gas density reduces the vertical temperature gradient near the single crystal, because gas convection is weak. The thermal stress in the crystal is small. Dislocations are hardly generated.

Furthermore because the crystal growth proceeds under the atmosphere of the element of group V, the volatilization of the element of group V is effectively suppressed. By these grounds the occurrences of lattice defects are conspicuously reduced.

(B) This invention requires no balancing apparatus for adjusting the pressures of the inner atmosphere 14 and the outer atmosphere 16. The volatilization of the element of group V from the material melt and the crystal is effectively suppressed by controlling the pressure of the outer atmosphere 16.

If the inner vessel contains only the gas of the element of group V, the vapor pressure $Q_O$ of the element of group V would be controlled within the the range from 0 atm to several atm. Especially if the vapor pressure is high, the dissociation pressure would greatly change with a subtle change of the temperature of the second heater 18. It would be difficult to keep the inner atmosphere 14 at an arbitrary pressure. This difficulty in pressure control is the defect of the case of the single atmospheric gas in the inner vessel.

On the contrary in this invention, the inner vessel 1 contains an inactive gas and a gas of the element of group V. The pressure of the inner atmosphere 14 is the sum of the pressure $P_O$ of the inactive gas and the pressure $Q_O$ of the gas of the element of group V. $Q_O$ is safely set to be equal or slightly greater than the dissociation pressure of the gas of group V to prevent the volatilization of the element of group V from the grown crystal. In this case $Q_O$ is small.

Because $Q_O$ is small, the vapor pressure $Q_O$ changes very slightly with a considerable change of the temperature of the second heater 18. Furthermore the pressure $P_O$ of the inactive gas is an independent variable. The inner atmosphere 14 can be pressurized to an arbitrarily high pressure by supplying inactive gas into the inner vessel 1.

As shown in FIG. 1 the material melt 5 is encapsulated by the liquid encapsulant 21, which is pressed by the total pressure $(P_O + Q_O)$. Because the pressure $P_O$ can be independently adjusted, the pressure acting on the liquid encapsulant 21 can be arbitrarily controlled. The independent adjustability of $P_O$ enables prevention of the volatilization of the element of group V from the material melt 5.

To prevent the volatilization of the element of group V from the crystal 7, the partial pressure $Q_O$ of the element of group V must be slightly higher than the dissociation pressure of the element of group V on the surface of the crystal.

Temperature control of the second heater 18 is easy because the change of temperature does not cause a significant change of vapor pressure $Q_O$.

(C) Balancing of the pressures between the inner atmosphere and the outer atmosphere is easy for the reasons noted above at (B). A stable temperature distribution is realized near the crucible. This ensures a stable growth of a single crystal.

(D) The structure of the apparatus is rather simple. The operation is easy. This invention does not require a device for watching the pressure balance between the inner and outer atmospheres nor a device for readjusting the pressure balance. This invention only requires that some pertinent vapor pressure $Q_O$ of the element of group V exists in the inner vessel.

The advantages can be also obtained, when this method is applied to the crystal growth of compound semiconductors of groups II-VI.

EMBODIMENT I (InAs)

This invention is applied to the crystal growth of an InAs single crystal below.

Into a crucible, InAs polycrystal, encapsulant material ($B_2O_3$) and 0.5 wt % of Ga element are charged. An As lump is positioned in the inner vessel. Nitrogen gas is filled in the inner vessel and in the outer vessel up to 1.7 atm. The first heater 17 and the fourth heater 20 are electrified. Liquid encapsulants 10 and 11 seal the openings 8 and 9.

Heating of the InAs polycrystal in the crucible is started at the same time as heating the As-lump 12. The encapsulant material is melted. This liquid encapsulant covers the InAs polycrystal. Then the InAs polycrystal is melted also.

The temperature of the As-lump 12 is adjusted by changing the output power of the second heater 18.

The dissociation pressure of As in the InAs melt at seeding is 0.33 atm. Then the output of the second heater 18 is adjusted to keep the As-lump 12 at 590° C., which is the temperature needed to keep the As-vapor pressure within the range from 0.33 atm to 1 atm.

The inner atmosphere 14 contains both As gas and $N_2$ gas. The total pressure in the inner atmosphere 14 is 2.0 to 2.1 atm.

The outer atmosphere 16 contains only 2.0 atm of nitrogen gas. The total inner pressure ($P_O + Q_O + R_O$) in the inner vessel is equal to or more than the outer pressure $P_1$.

The heated As-lump 12 is then sublimed. The vapor pressure $Q_O$ increases from 0 atm to a pertinent pressure. Excess nitrogen gas flows to the outer vessel 15 through the liquid encapsulants 10 and 11. This flow equalizes the pressures between the inner vessel and the outer vessel. The gas does not flow from the outer vessel 15 to the inner vessel 1 because the inner pressure is higher than the outer pressure.

The crystal is grown with rotation of the crucible at 6 revolutions per minute and a pulling speed of 3 to 6 mm/h. Under the conditions an InAs single crystal is grown with a diameter of is 50 mm. The length of the crystal is 180 mm.

Escape of As from the crystal grown does not occur. The dislocation density in the crystal is small. Escape of As from the rest of the material in the crucible does not occur at all.

In general the dissociation pressure of the As-solid (As-lump 12) is changed considerably by a small change of temperature. Therefore controlling the pressure of As by adjusting the temperature of As-solid is difficult.

However this invention only requires the adjustment of the temperature of the As-lump to that which generates 0.33 to 1 atm of As vapor pressure at seeding. The allowable range of temperature is wide. This ensures easy control of the temperature of the As-lump.

EMBODIMENT II (GaAs)

A GaAs single crystal doped with 0.6 wt % of Cr is grown by this invention as described below. The liquid encapsulant used is $B_2O_3$.

The dissociation pressure of As at seeding is about 1 atm which is a high pressure. The pressures of nitrogen gas both in the outer vessel 15 and the inner vessel 1 are then set at 1 to 20 atm.

Polycrystal material, encapsulant material and Cr as impurity are charged into the crucible. The crucible is set on the lower shaft. Encapsulant materials are filled in the cavity of the openings 10 and 11.

The inner vessel 1 is closed. The encapsulant materials are melted to liquid encapsulants 10 and 11 by the heaters 17 and 20. The second heater 18 and the third heater 19 are electrified. The As-lump 12 is heated and starts to sublime. The encapsulant material 21 is melted. Then material polycrystal is melted.

The output power of the heater 18 is adjusted so as to keep the temperature of the As-lump 12 at about 650° C. This temperature holds the As vapor pressure $Q_O$ within the range from 1 to 2 atm.

A Cr-doped single crystal is grown under these conditions. The crucible rotation is 1 to 10 rpm. The pulling speed is 3 to 10 mm/h. The single crystal grown is 60 mm in diameter and 120 mm in length.

No evidence of As-escaping from the crystal is found. Dislocations and other lattice defects are few. The obtained crystal is a single crystal of high quality. Sufficient vapor pressure of As exists in the inner vessel and low temperature gradient is realized near the crucible. As-escaping from the rest of the material in the crucible does not occur at all.

What is claimed is:

1. A method for growing a single crystal of compound semiconductors in an apparatus comprising an inner vessel having a top opening with a top cavity, and a bottom opening with a bottom cavity, and made of a material that does not chemically react with a Group V or Group II element a plurality of heaters each of said heaters surrounding said inner vessel at a vertically different position, an upper shaft passing through said top opening, said upper shaft being able to rotate and move up and down in said inner vessel, a lower shaft passing through said bottom opening, said lower shaft being able to rotate and move up and down in said inner vessel, a crucible supported by said lower shaft, and an outer vessel which encloses said inner vessel and said heaters, said method comprising the steps of:

charging compound semiconductor material, and an encapsulant material into said crucible, placing a lump of an element of group V or group II in said inner vessel, charging encapsulant materials into said top and bottom cavities, supplying an inactive gas into said inner vessel and said outer vessel, sealing said inner vessel by heating the encapsulant materials in said top and bottom cavities to form liquid encapsulants, melting the encapsulant material in said crucible to form crucible liquid encapsulant and melting the compound semiconductor material in said crucible to form a material melt covered with the crucible liquid encapsulant, heating the lump of the element of group V or group II to keep the partial pressure $Q_O$ of the gas of the element of group V or group II equal to or larger than the dissociation pressure $Q_d$ of the element of group II or group V at a temperature for seeding, controlling the total gas pressure in said inner vessel so as to be equal to or greater than the gas pressure in said outer vessel, dipping a seed crystal into said material melt and, pulling up a single crystal.

2. A method for growing a single crystal as claimed in claim 1, wherein the compound semiconductor material is InAs, the liquid encapsulant is $B_2O_3$, the inactive gas is nitrogen gas, and said lump is element As and the partial pressure of gas As, therefrom, is kept within the range from 0.3 to 1 atmosphere during the crystal growth.

3. A method for growing a single crystal as claimed in claim 1, wherein the compound semiconductor material is GaAs, the liquid encapsulant is $B_2O_3$, the inactive gas is nitrogen gas, and said lump is element As and the partial pressure of gas As, therefrom, is kept within the range from 1 to 2 atmosphere during the crystal growth.

4. A method as in claim 1 wherein the charging step comprises charging said compound semiconductor material, an said encapsulant material and an impurity element into said crucible, and the supplying step comprises supplying said inactive gas and a gas of said impurity element into said inner vessel, and said inactive gas to said outer vessel.

* * * * *